United States Patent
Ramdani et al.

(10) Patent No.: US 8,507,947 B2
(45) Date of Patent: Aug. 13, 2013

(54) HIGH QUALITY GAN HIGH-VOLTAGE HFETS ON SILICON

(75) Inventors: Jamal Ramdani, Raritan, NJ (US); John P. Edwards, Verona, NJ (US); Linlin Liu, Hillsborough, NJ (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 13/316,305

(22) Filed: Dec. 9, 2011

(65) Prior Publication Data

US 2013/0146863 A1    Jun. 13, 2013

(51) Int. Cl.
*H01L 31/072* (2012.01)

(52) U.S. Cl.
USPC .................................. 257/190; 257/E33.025

(58) Field of Classification Search
USPC ...................... 257/76, 190, E33.025
See application file for complete search history.

(56) References Cited

U.S. PATENT DOCUMENTS 7,612,361 B2 * 11/2009 Park et al. ........................ 257/13
2004/0200406 A1 10/2004 Peczalski et al.

OTHER PUBLICATIONS

European Search Report received for European Patent Application No. 12193443.4 mailed on Apr. 18, 2013, 4 pages.
Fenwick et al., "MOCVD Growth of GaN on Si Substrates using an ALD-Grown Al2O3 Interlayer", Ninth International Conference on Solid State Lighting, Proceedings of the SPIE, vol. 7422, 2009, pp. 1-8.
Kikuchi et al., "Improvement of Crystal Quality of RF-Plasma-Assisted Molecular Beam Epitaxy Grown Ga-Polarity GaN by High-Temperature Grown AlN Multiple Intermediate Layers", Japanese Journal pf Applied Physics, vol. 39, 2000, pp. 330-333.
Schenk et al., "Growth of Thick, Continuous GaN Layers on 4-in. Si Substrates by Metalorganic Chemical Vapor Deposition", Journal of Crystal Growth, vol. 314, 2011, pp. 85-91.
Zhang et al., "Annealing of Al2O3 Thin Films Prepared by Atomic Layer Deposition", Journal of Physics D: Applied Physics, vol. 40, 2007, pp. 3707-3713.
Office Action received for European Patent Application No. 12193443.4, mailed on May 2, 2013, 8 pages.

* cited by examiner

*Primary Examiner* — Quoc Hoang
(74) *Attorney, Agent, or Firm* — Morrison & Foerster LLP (57) ABSTRACT

Substrates of GaN over silicon suitable for forming electronics devices such as heterostructure field effect transistors (HFETs), and methods of making the substrates, are disclosed. Voids in a crystalline $Al_2O_3$ film on a top surface of a silicon wafer are formed. The top surface of the silicon wafer is along the <111> silicon crystal orientation. A plurality of laminate layers is deposited over the voids and the $Al_2O_3$ film. Each laminate layer includes an AlN film and a GaN film. A transistor or other device may be formed in the top GaN film.

9 Claims, 6 Drawing Sheets

HIGH QUALITY GAN HIGH-VOLTAGE HFETS ON SILICON

BACKGROUND

1. Field

The present disclosure relates generally to gallium nitride (GaN) substrates, and, more specifically, the present disclosure relates to a method for fabricating a GaN substrate on silicon.

2. Description of Related Art

Wide-bandgap semiconductors are widely used for fabricating active devices for high-voltage applications. One type of semiconductor structure known as a heterostructure field effect transistors (HFET) (also called high-electron mobility transistors (HEMT)) uses wide-bandgap semiconductors to implement transistors for high-performance power electronics. In one example, wide-bandgap HFET devices may be used as a switching element in high-voltage switching power converters.

GaN is one example of a wide-bandgap semiconductor that has generated particular interest. For example, AlGaN/GaN HFETs show promise for power electronics due to their wider bandgap and high-electron saturation velocity, both of which enable high-voltage operation. However, the difficulty and expense in forming GaN substrates have limited the application of GaN-based devices to specific markets.

A GaN substrate is typically manufactured by growing GaN film on another substrate, due to the expense and difficulty of manufacturing bulk GaN wafers. For example, silicon carbide (SiC) or sapphire ($Al_2O_3$) wafers may be used as handle wafers for a GaN substrate (i.e., a GaN film is deposited over the handle wafer). However, sapphire is a poor thermal conductor and can present difficulties during packaging, and SiC wafers are still very expensive. Moreover, both types of wafers are only available as smaller-diameter wafers, which eliminate the economy of scales available with larger diameters.

Another option for creating GaN substrates is using a silicon handle wafer, which is inexpensive and available in large diameters. Additionally, backend grinding and lapping needed for packaging is well developed for silicon wafers. However, due to a large lattice mismatch and large thermal mismatch between GaN and silicon, it may be difficult to reliably grow GaN directly on a silicon (Si) substrate. Instead, the epitaxial growth of crack-free GaN on silicon may require extensive buffer layer engineering to minimize the bow and warp during and after growth. In addition, high-voltage applications (e.g., above 600 V) may require buffer layers in excess of 2.5 μm and even up to 4 μm (e.g., for 1,000 V applications).

DESCRIPTION OF THE FIGURES

Various aspects, features, and advantages of several embodiments of the present invention will be more apparent from the following more particular description thereof, presented in conjunction with the following drawings.

Non-limiting and non-exhaustive embodiments of the present invention are described with reference to the following Figures, wherein like reference numerals refer to like parts throughout the various views unless otherwise specified.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Figure 4:
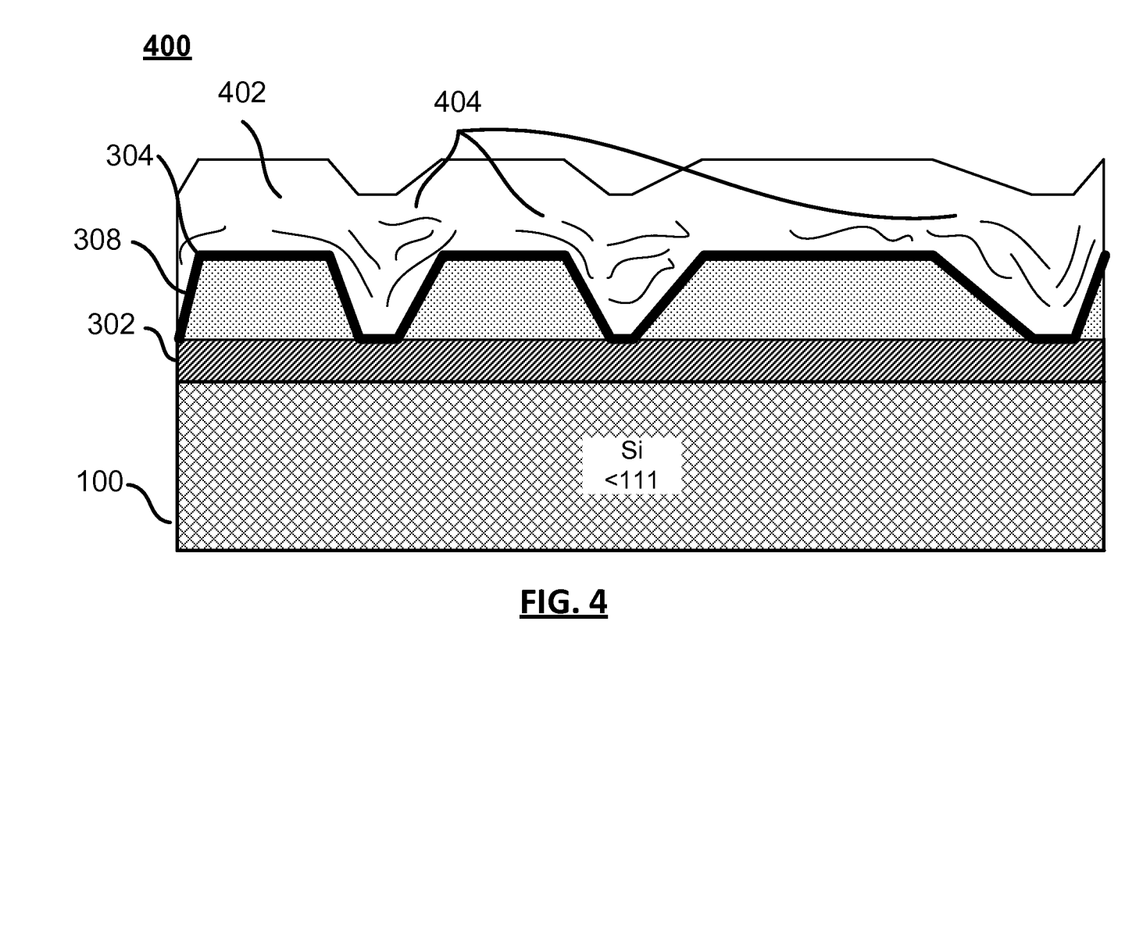
FIG. 4 illustrates a substrate at yet another stage of fabrication of a GaN substrate after a GaN film has been grown on top of an AlN film in accordance with an embodiment of the present invention.
Figure 5:
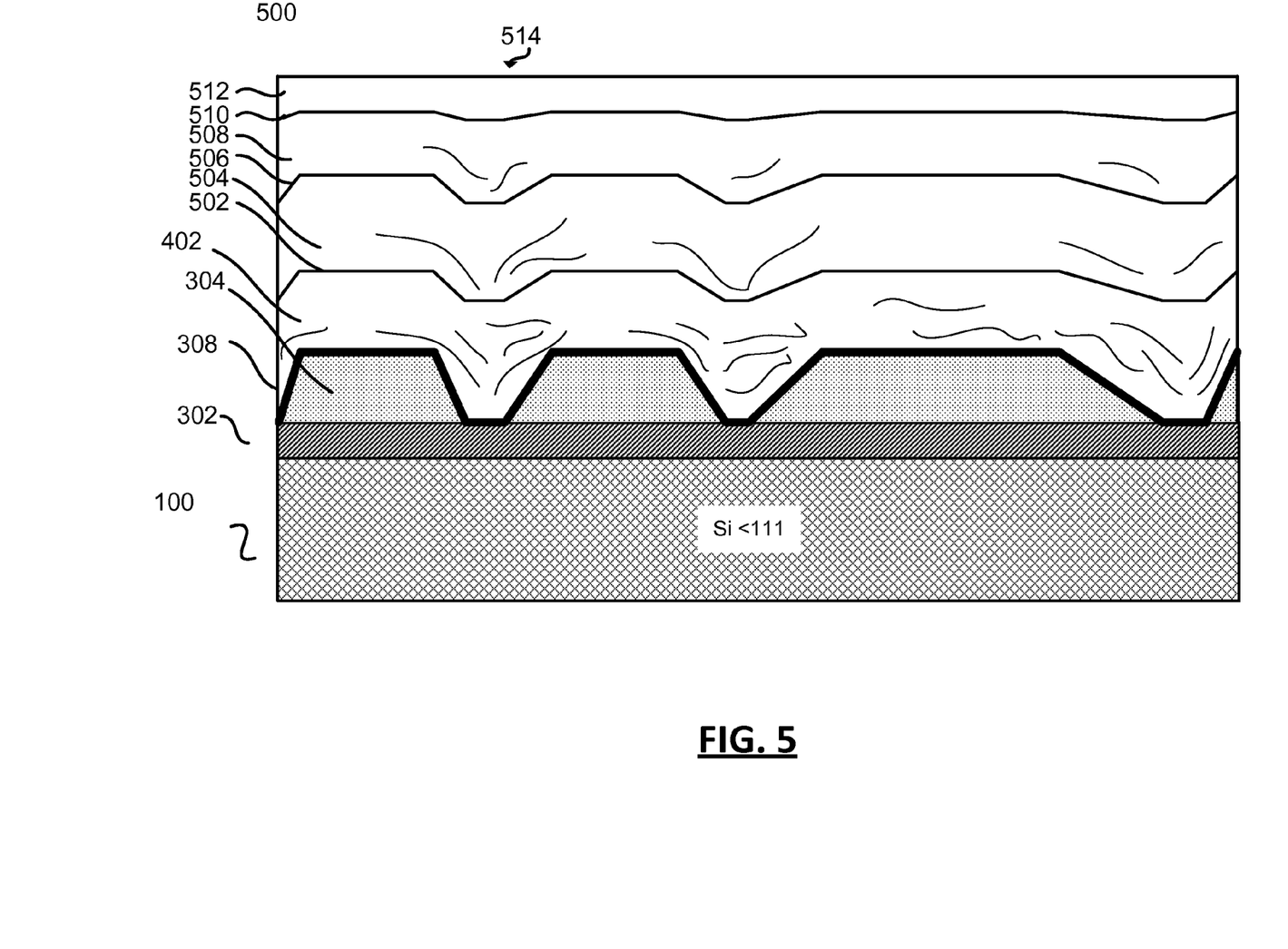
FIG. 5 illustrates a substrate at still another stage of fabrication of a GaN substrate after several more interleaved layers of GaN and AlN films have been grown to form a surface suitable for HFET formation in accordance with an embodiment of the present invention.
Figure 6:
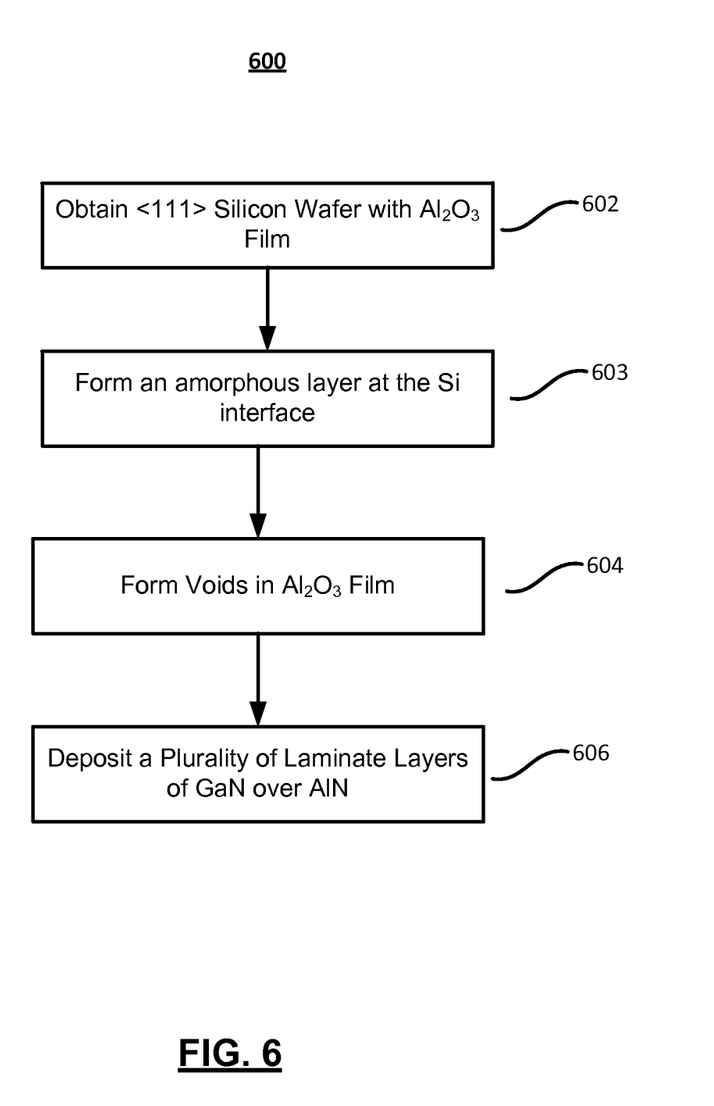
FIG. 6 is a flowchart for an example process of fabricating a GaN substrate that may be suitable for forming transistors and other devices in accordance with an embodiment of the present invention.

FIGS. 1-5 illustrate a GaN substrate at various stages of an example process illustrated in FIG. 6 for creating a GaN substrate that may be suitable for use in fabricating transistors, such as HFETs. The blocks of flowchart 600 (FIG. 6) are explained below with respect to FIGS. 1-5 and several example processing operations and steps. The features, shapes, and proportions of the substrate and structures shown in FIGS. 1-5 are not limiting on the claims. Additionally, it should be understood that the explanation below is for one example and is not limiting on the claims.

Figure 1:
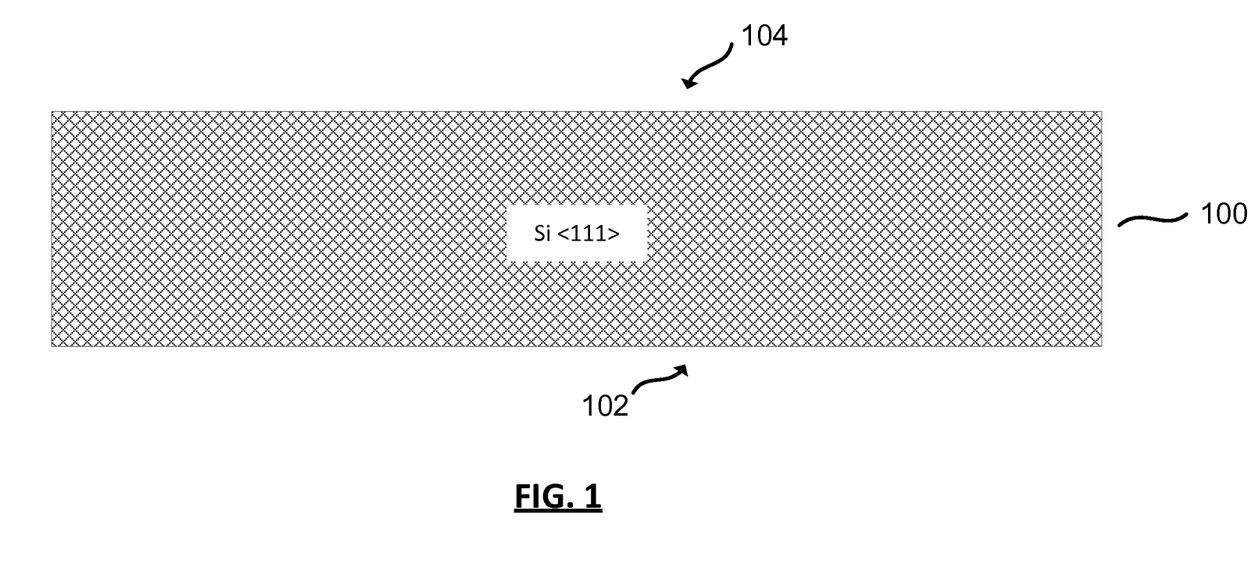
FIG. 1 illustrates an example silicon wafer with exposed surfaces along the <111> crystal orientation for use in fabricating a GaN substrate in accordance with an embodiment of the present invention.

As shown in FIG. 1, which depicts an initial stage of fabrication of a GaN substrate, a wafer 100 includes a top surface 104 and a bottom surface 102. In the example shown in FIG. 1, wafer 100 is a <111> silicon wafer. In this example, wafer 100 is a <111> silicon wafer because top surface 104 and bottom surface 102 expose the <111> crystal orientation of the crystalline silicon that forms the wafer. As described below, wafer 100 may be used as a handle wafer to grow a GaN film (not shown). For example, a GaN film (not shown) may be grown over top surface 104 of wafer 100 or an intermediary layer. Wafer 100 may be a typical thickness, for example, between 500 μm and 1,000 μm, although other thicknesses may also be used.

Figure 2:
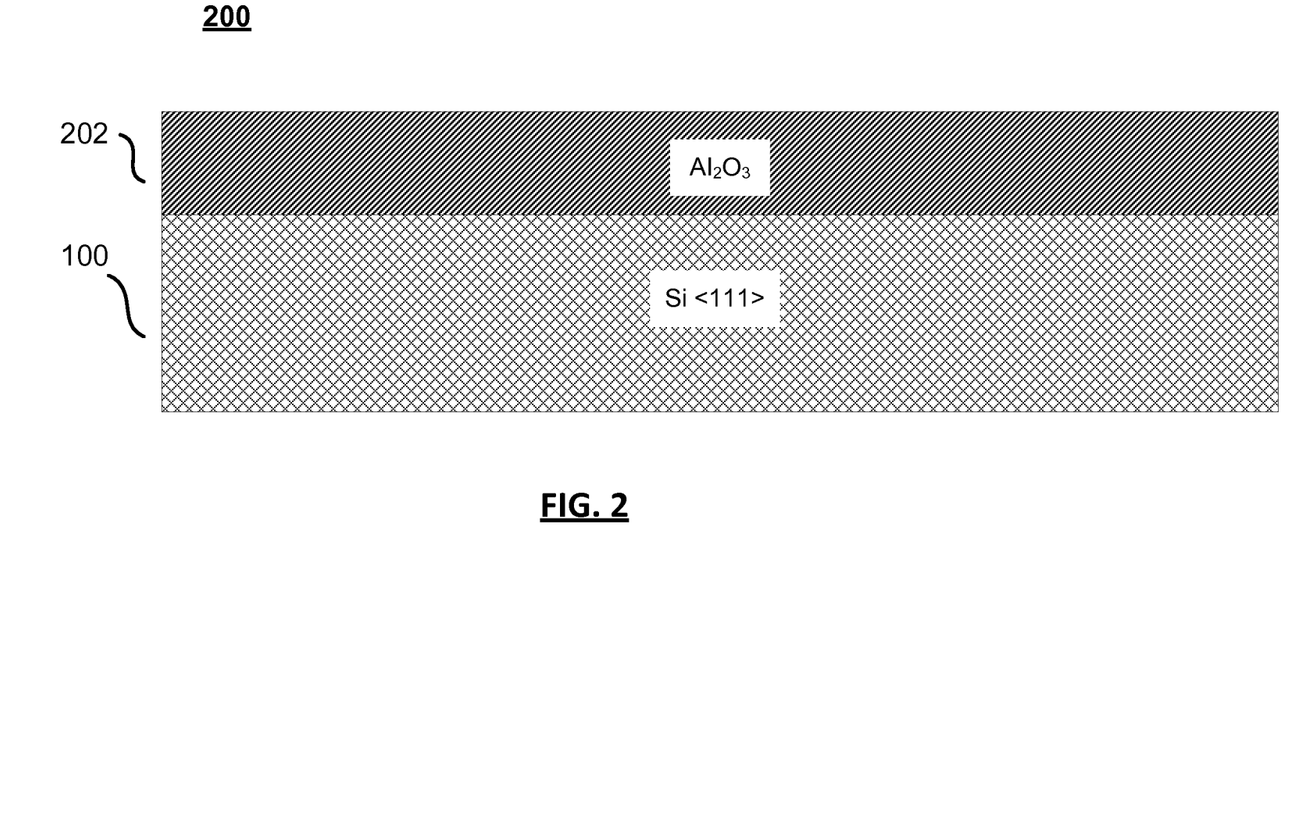
FIG. 2 illustrates a substrate at a stage of fabrication of a GaN substrate with a film of crystalline aluminum oxide $Al_2O_3$ on the top surface of the wafer in accordance with an embodiment of the present invention.

Referring now to FIG. 2, which illustrates a substrate 200 after a stage during the fabrication of a GaN substrate, an aluminum oxide ($Al_2O_3$) film 202 interfaces with top layer 104 of wafer 100. In one example, $Al_2O_3$ film 202 provides a surface that is similar to the surface of a sapphire substrate, which may allow for reuse of processes developed for sapphire substrates. In addition, $Al_2O_3$ film 202 may also act as a seed layer for subsequent film growth. For example, $Al_2O_3$ film 202 may be a seed layer for a subsequent aluminum nitride (AlN) film. In another example, $Al_2O_3$ film 202 may have a c-axis orientation, which matches the <111> surface of the silicon wafer (both are hexagonal). Crystalline $Al_2O_3$ film 202 may be from 5 nm to 50 nm. In one example crystalline $Al_2O_3$ film 202 is about 5 nm.

As further shown, FIG. 2 illustrates wafer 100 after crystalline $Al_2O_3$ film 202 is grown over top surface 104 (FIG. 1) of wafer 100. In one example, $Al_2O_3$ film 202 is grown using a molecular beam epitaxy (MBE) tool and MBE process so that $Al_2O_3$ film 202 is directly on the surface of wafer 100. Specifically, MBE allows deposition at lower temperatures, which may prevent oxidation of the silicon. Higher levels of vacuum while depositing $Al_2O_3$ film 202 may also help prevent oxidation of the silicon. Other tools and processes, such as chemical vapor deposition (CVD) processes and tools, may also be used to form $Al_2O_3$ film 202 (with or without an intervening layer between $Al_2O_3$ film 202 and the silicon surface of wafer 100).

In one example, due to the lattice mismatch between $Al_2O_3$ film 202 and wafer 100, wafer 100 may exert a tensile stress on $Al_2O_3$ film 202. Dislocations formed in $Al_2O_3$ film 202 may relax the initial tensile stress and reduce warping. As will be described further below, additional GaN film layers may be grown on top of $Al_2O_3$ film 202, which may allow a compressive stress to be exerted on $Al_2O_3$ film 202 and contribute to alleviating the initial tensile stress and to limiting warp in wafer 100.

In one example, crystalline $Al_2O_3$ film 202 may be in direct contact with wafer 100, i.e., there are no intervening films between the top surface 104 of wafer 100 and $Al_2O_3$ film 202. This may be the case if, for example, $Al_2O_3$ film 202 was deposited in a manner that prevents oxidation of the surface of wafer 100 prior to formation of crystalline $Al_2O_3$ film 202. In one embodiment, semiconductor device 200 may be processed in a particular manner to allow an intermediate film (not shown) be formed between silicon wafer 100 and $Al_2O_3$ film 202 to alleviate stress or for another purpose. For example, a layer of silicon aluminum oxide may be formed to relieve stress where wafer 100 interfaces with crystalline $Al_2O_3$ film 202.

Figure 3:
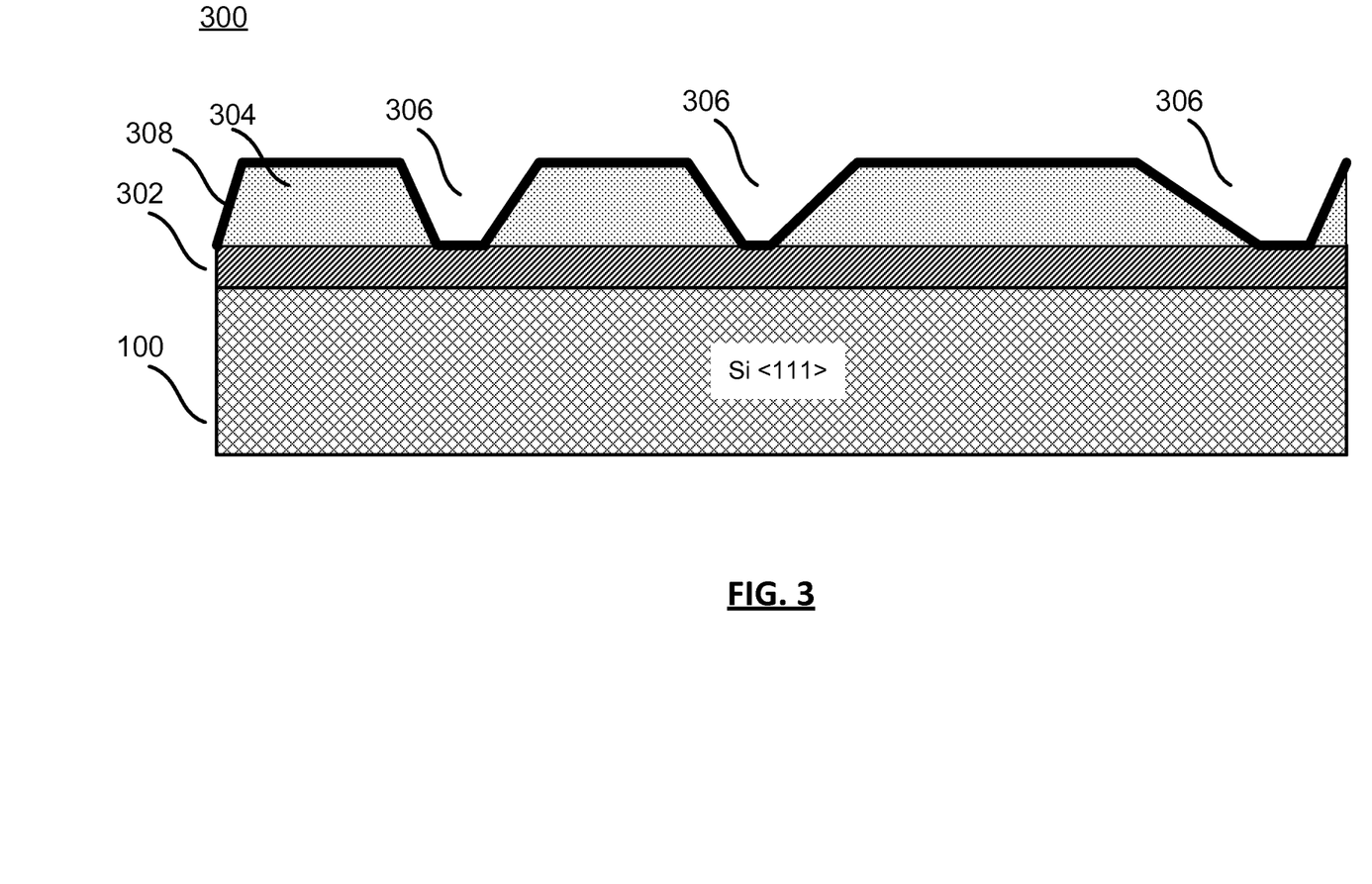
FIG. 3 illustrates a substrate at another stage of fabrication of a GaN substrate with an amorphous film under the $Al_2O_3$ film in accordance with an embodiment of the present invention.

Referring now to FIG. 3, which illustrates a substrate 300 after a stage during the fabrication of a GaN substrate, an amorphous film 302 is formed between wafer 100 and $Al_2O_3$ film 304 in accordance with of embodiments of the present invention. In one example, amorphous film 302 is includes aluminum, silicon, and oxygen (AlSiO) from wafer 100 and $Al_2O_3$ film. In some examples, voids 306 may form and change the surface topology of $Al_2O_3$ film 202 as originally grown to form $Al_2O_3$ film 304. Specifically, voids 306 may allow for reducing the density of dislocation through an annihilation process. The bottom of some voids 306 may expose amorphous AlSiO film 302; however, not all voids must expose amorphous AlSiO film 302. Additionally, AlN film 308 has been formed over $Al_2O_3$ film 304 and exposed portions of amorphous film 302. In other examples, amorphous film 302 may be formed without voids. Also, in some cases AlN film 308 may not be formed on portions of amorphous film 302 that are exposed at the bottom of voids 306.

In one example, amorphous film 302 may form between $Al_2O_3$ film 304 and wafer 100 during a high-temperature anneal that may also cause $Al_2O_3$ film 304 to pool and form voids 306 that may expose portions of amorphous film 302. Voids 306 may be filled in by subsequent film depositions and/or later overgrowth on the surface of $Al_2O_3$ film 304 and may promote threading dislocation annihilation in later-formed GaN films by causing threading dislocations to curl back into other threading dislocations. In another example, voids 306 may also divert dislocations from traveling up to the substrate surface where fracture may occur. Even though voids 306 form in $Al_2O_3$ film 304, regions of $Al_2O_3$ film 304 may still maintain crystalline structure.

In one example, amorphous film 302 may relieve the stress between $Al_2O_3$ film 304 and wafer 100. The thickness of amorphous film 302 may be controlled by the temperature of wafer 100 and time at which wafer 100 is held at that temperature. In one example, amorphous film 302 may start to form at temperatures as low as 800° C. Typical thicknesses of amorphous film 302 are 2 nm to 10 nm. In one case, amorphous film 302 is 2 nm thick.

In an example process, void 306 and the AlSiO amorphous film 302 are formed during the process to grow an initial AlN film 308 on $Al_2O_3$ film 304 in a metal organic chemical vaport deposition (MOCVD) tool. The first step of growing AlN film 308 may be a high-temperature anneal that removes contamination from the surface of $Al_2O_3$ film 304 prior to growing AlN film 308. For example, this high-temperature anneal may be about 850° C. to 950° C. for 5 to 20 minutes. During this high-temperature anneal, voids 306 and amorphous film 302 may form. An example recipe for creating AlN film 308 starts with a nitridation process to form a thin AlN film on $Al_2O_3$ film 308. Then, a low-temperature AlN film may be formed using (ammonia) $NH_3$ as a nitrogen source and trimethylaluminum (TMA) as an aluminum source in an MOCVD chamber. In other words, the TMA provides aluminum that nucleates at the surface with nitrogen from the $NH_3$ to form an AlN film at a temperature of about 550° C. to 650° C. Once the AlN film is formed, the temperature may be raised as high as 1050° C. for about 1 to 5 minutes to crystallize AlN. In one example, AlN film 308 may be, for example, about 20 nm thick, but the thickness may also be between 10 nm and 200 nm.

FIG. 4 illustrates a substrate 400 after a stage during the fabrication of a GaN substrate. A first laminate layer has been formed, which includes AlN film 308 discussed above with respect to FIG. 3 and GaN film 402. As illustrated in FIG. 4, the voids from $Al_2O_3$ film 304 are still present in the surface of GaN film 402. However, the sizes of the voids have been significantly reduced. Additionally, threading dislocations 404 can be seen in GaN film 402, particularly in the regions above the voids in $Al_2O_3$ film 304.

The AlN film may be grown over the $Al_2O_3$ film and exposed amorphous film if the AlN film is part of the first laminate layer. Subsequent laminate layers may have an AlN film grown over a GaN film of the preceding laminate layer. The AlN film may be grown as described above with respect to block 604. Alternatively, other processes with different temperatures, growth rates, and V/III ratios may be used. For example, the first laminate layer (where the AlN film is formed on the $Al_2O_3$ film and exposed amorphous film) includes an AlN film that may be formed with a high-temperature process, but subsequent layers of AlN film used in subsequent laminate layers may use a process recipe that uses a lower peak temperature than the recipe used for the AlN film of the first laminate layer. As other examples, the recipe for later-grown AlN films may omit the crystallization or nitridation steps. The AlN film of each laminate layer may be, for example, about 20 nm thick, but thickness may also be between 10 nm and 200 nm.

After the AlN film is grown, a GaN film is grown over the AlN film. For example, an MOCVD tool may be used to grow the GaN film. One example recipe may include a temperature of 1030° C., a pressure of 100 Torrs, and a V/III ratio (e.g., ratio of $NH_3$ to trimethylgallium (TMGA)) of about 2000, and a growth rate of 2 μm/hr. In some cases, the same MOCVD chamber used for growing the AlN film may be used for the GaN film without removing the wafer from the tool. In other cases, separate tools may be used for the AlN film and the GaN film. The GaN film in each of the plurality of laminate layers may be from 500 nm to 50,000 nm thick. The last GaN film may be several microns thick to support high-voltage (e.g., above 600 V) devices.

Due to the formation of the voids in the $Al_2O_3$ film (discussed above with respect to FIG. 3), the GaN film of the first laminate layer will not grow as a perfect crystal. Instead, this GaN film will have a relatively high density of defects, such as dislocations, and in particular, threading dislocations. Regions in the GaN film over a void in the $Al_2O_3$ may have a particularly high threading dislocation density. After at least 2 (e.g., 2, 3, 4, 5, or more) laminate layers, a transistor (or other devices) such as an AlGaN/GaN HFET may be formed in the GaN film of the top laminate layer. This top GaN film may have a thickness that is suitable for the particular type of device to be formed. For example, if high-voltage (e.g., above 600 V) devices are to be formed, a top GaN film thickness of at least 2.5 μm may be desired. If even higher-voltage (e.g., 1000 V) devices are to be formed, a top GaN film thickness of 4 μm may be required.

FIG. 5 illustrates a substrate 500 after another stage during the fabrication of a GaN substrate. Three additional laminate layers have been grown. Specifically, a laminate layer of AlN film 502 and GaN film 504, a laminate layer of AlN film 506 and GaN film 508, and a laminate layer of AlN film 510 and GaN film 512 have been grown. As can be seen, the threading dislocation density decreases in the GaN film for each subsequent laminate layer. Similarly, the voids from $Al_2O_3$ film 302 shrink with each additional laminate layer. Top surface 514 of GaN film 512 may be suitable for forming a transistor (or other device), such as an AlGaN/GaN HFET.

After at least 2 (e.g., 2, 3, 4, 5, or more) laminate layers, a transistor (or other devices) such as an AlGaN/GaN HFET may be formed in the GaN film of the top laminate layer. This top GaN film may have a thickness that is suitable for the particular type of device to be formed. For example, if high-voltage (e.g., above 600 V) devices are to be formed, a top GaN film thickness of at least 2.5 μm may be desired. If even higher-voltage (e.g., 1000 V) devices are to be formed, a top GaN film thickness of 4 μm may be required. Additionally, while GaN film 512 is illustrated without any threading dislocations, this represents that GaN film 512 has an improved threading dislocation density as compared to some or all of the previous laminate layers.

Depending on the thickness of the first GaN film, one or more of the voids may still be present on the surface of the GaN film. However, as additional laminate layers are grown, the regions over the voids may have high rates of threading dislocation annihilation, even after just a second laminate layer. In other words, the GaN film of each laminate layer may have a lower threading dislocation density than the GaN film of the previous laminate layer. Accordingly, after some number of laminate layers, the GaN film may be flat (the voids are not visible on the surface) and the threading dislocation density may be at an acceptable level. Additionally, by using multiple laminate layers instead of a single thicker layer, some dislocation lines may be redirected from traveling up vertically to the surface and forming cracks.

Accordingly, the new buffer layer described above may act like a sapphire substrate allowing easy transfer of epitaxial processes developed on sapphire. The buffer allows for a GaN substrate that may be less expensive than using sapphire substrates. Notably, the growth of GaN films on $Al_2O_3$ may also be under continuous compressive stress (unlike when GaN is grown directly on silicon, where the GaN film can be either tensile or compressive, depending on the combination of layers used for stress engineering). The compressive stress of the GaN may compensate for the tensile stress generated by the thermal mismatch between silicon and GaN during cooldown of the substrate. This compensation may lead to crack-free GaN film, a thicker GaN film for high-voltage applications, and simplified transfer to 6-inch or 8-inch silicon substrates.

FIG. 6 shows flow chart 600 for an example process of creating a GaN substrate. In block 602, a <111> silicon wafer is obtained with an $Al_2O_3$ film on a top surface. In block 603, an amorphous layer is formed at the interface between the Si wafer and $Al_2O_3$. In block 604, voids are formed in the $Al_2O_3$ film using, for example, a high-temperature anneal. In block 606, a plurality of laminate layers are formed. Each laminate layer includes a GaN film on top of an AlN film.

The above description of illustrated examples of the present invention, including what is described in the Abstract, are not intended to be exhaustive or to be limitations to the precise forms disclosed. While specific embodiments of, and examples for, the invention are described herein for illustrative purposes, various equivalent modifications are possible without departing from the broader spirit and scope of the present invention. Indeed, it is appreciated that the specific examples of thicknesses, materials, processing operations, etc., are provided for explanation purposes, and that other thicknesses, materials, processing operations, etc. may also be employed in other embodiments, examples, and processes in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A GaN substrate comprising
a silicon substrate having a top surface and a bottom surface along the <111> crystal orientation;
a $Al_2O_3$ film over the top surface of the silicon substrate, wherein the $Al_2O_3$ film is crystalline;
an amorphous film between the top surface of the silicon substrate and the $Al_2O_3$ film; and
a plurality of laminate layers over the $Al_2O_3$ film, wherein each laminate layer includes a GaN film over a AlN film.

2. The GaN substrate of claim 1, further comprising:
a plurality of voids defined in the $Al_2O_3$ film.

3. The GaN substrate of claim 2, wherein the GaN film of a last laminate layer furthest away from the silicon substrate is at least 2.5 µm thick.

4. The GaN substrate of claim 3, wherein the GaN film of the last laminate layer is at least 4 µm thick.

5. The GaN substrate of claim 2, further comprising:
 a transistor formed on a last laminate layer furthest away from the silicon substrate.

6. The GaN substrate of claim 2, wherein a first laminate layer closest to the top surface of the silicon substrate fills in the voids.

7. The GaN substrate of claim 6, wherein a second laminate layer has a lower threading dislocation density than the first laminate layer, wherein the second laminate layer is further away from the top surface of the silicon substrate as compared to the first laminate layer.

8. The GaN substrate of claim 1, wherein the plurality of laminate layers is only three laminate layers.

9. The GaN substrate of claim 1, wherein the plurality of laminate layers is only four laminate layers.

* * * * *